US011146291B2

(12) United States Patent
Gad et al.

(10) Patent No.: US 11,146,291 B2
(45) Date of Patent: Oct. 12, 2021

(54) CONFIGURING ITERATIVE ERROR CORRECTION PARAMETERS USING CRITERIA FROM PREVIOUS ITERATIONS

(71) Applicant: Micron Technology, Inc., Boise, ID (US)

(72) Inventors: Eyal En Gad, Santa Clara, CA (US); Zhengang Chen, San Jose, CA (US); Sivagnanam Parthasarathy, Carlsbad, CA (US); Yoav Weinberg, Thornhill (CA)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/806,777

(22) Filed: Mar. 2, 2020

(65) Prior Publication Data

US 2021/0273652 A1 Sep. 2, 2021

(51) Int. Cl.
*G06F 11/00* (2006.01)
*G06F 11/30* (2006.01)
*G08C 25/00* (2006.01)
*H03M 13/00* (2006.01)
*H04L 1/00* (2006.01)
*H03M 13/11* (2006.01)
*H03M 13/09* (2006.01)
*H03M 13/29* (2006.01)
*H03M 13/15* (2006.01)

(52) U.S. Cl.
CPC ..... *H03M 13/1128* (2013.01); *H03M 13/098* (2013.01); *H03M 13/15* (2013.01); *H03M 13/2942* (2013.01)

(58) Field of Classification Search
None
See application file for complete search history.

(56) References Cited

U.S. PATENT DOCUMENTS

| | | | |
|---|---|---|---|
| 9,564,931 B1* | 2/2017 | Nguyen | H03M 13/616 |
| 2014/0281785 A1* | 9/2014 | Fainzilber | H03M 13/1111 714/752 |
| 2016/0179620 A1* | 6/2016 | Bazarsky | H03M 13/3707 714/766 |
| 2017/0117925 A1* | 4/2017 | Achtenberg | G06F 11/1072 |
| 2018/0032396 A1* | 2/2018 | Sharon | G06F 3/064 |
| 2018/0034477 A1* | 2/2018 | Zamir | H03M 13/1108 |
| 2018/0219561 A1* | 8/2018 | Litsyn | H03M 13/2948 |
| 2020/0091933 A1* | 3/2020 | Tate | H03M 13/2906 |

* cited by examiner

*Primary Examiner* — Guerrier Merant
(74) *Attorney, Agent, or Firm* — Lowenstein Sandler LLP

(57) ABSTRACT

A processing device in a memory system reads a sense word from a memory device and executes a plurality of parity check equations on corresponding subsets of the sense word to determine a plurality of parity check equation results. The processing device determines a syndrome for the sense word using the plurality of parity check equation results, determines whether the syndrome for the sense word satisfies a codeword criterion, and responsive to the syndrome for the sense word not satisfying the codeword criterion, performs an iterative LDPC correction process, wherein at least one iteration after a first iteration in the LDPC correction process uses a criterion based at least partially on a previous iteration or partial iteration.

20 Claims, 9 Drawing Sheets

| | SWB 0 | SWB 1 | SWB 2 | SWB 3 | SWB 4 | SWB 5 | SWB 6 | SWB 7 |
|---|---|---|---|---|---|---|---|---|
| SYNDROME 320 | | | | | SENSE WORD 310 | | | |
| SB0  0 | 1 | 0 | 1 | 1 | 0 | 0 | 1 | 0 |
| SB1  0 | 1 | 1 | 1 | 0 | 1 | 0 | 0 | 0 |
| SB2  1 | 1 | 1 | 1 | 0 | 0 | 1 | 0 | 0 |
| SB3  1 | 1 | 0 | 1 | 1 | 0 | 0 | 0 | 0 |
| SB4  0 | 0 | 1 | 0 | 1 | 1 | 1 | 1 | 1 |
| SB5  1 | 0 | 0 | 1 | 1 | 1 | 1 | 0 | 0 |
| SB6  0 | 0 | 0 | 0 | 1 | 0 | 0 | 1 | 1 |
| SB7  1 | 0 | 0 | 0 | 1 | 0 | 1 | 0 | 1 |

FIG. 3

| | SWB 0 | SWB 1 | SWB 2 | SWB 3 | SWB 4 | SWB 5 | SWB 6 | SWB 7 | CORRECTED WORD 510 |
|---|---|---|---|---|---|---|---|---|---|
| SB0 0 | 1 | 0 | 1 | 1 | 0 | 0 | 1 | 1 | |
| SB1 0 | 1 | 1 | 1 | 0 | 1 | 0 | 0 | 0 | |
| SB2 1 | 1 | 1 | 1 | 0 | 0 | 0 | 0 | 0 | |
| SB3 0 | 1 | 1 | 0 | 0 | 0 | 1 | 0 | 0 | |
| SB4 0 | 1 | 0 | 0 | 1 | 1 | 0 | 1 | 1 | |
| SB5 0 | 0 | 1 | 1 | 1 | 1 | 1 | 1 | 0 | |
| SB6 1 | 0 | 0 | 0 | 1 | 0 | 1 | 1 | 1 | |
| SB7 0 | 0 | 0 | 0 | 1 | 0 | 1 | 0 | 1 | |

SYNDROME 520

FIG. 5

|  | SWB 0 | SWB 1 | SWB 2 | SWB 3 | SWB 4 | SWB 5 | SWB 6 | SWB 7 |
|---|---|---|---|---|---|---|---|---|
| CORRECTED WORD 810 | 1 | 0 | 1 | 1 | 0 | 0 | 0 | 1 |
| SYNDROME 820 | | | | | | | | |
| SB0  0 | 1 | 1 | 1 | 0 | 1 | 0 | 0 | 0 |
| SB1  0 | 1 | 1 | 1 | 0 | 0 | 1 | 0 | 0 |
| SB2  0 | 1 | 1 | 1 | 0 | 0 | 0 | 1 | 0 |
| SB3  1 | 1 | 0 | 0 | 1 | 1 | 0 | 0 | 0 |
| SB4  1 | 0 | 1 | 0 | 1 | 1 | 1 | 1 | 1 |
| SB5  0 | 0 | 0 | 1 | 1 | 1 | 1 | 1 | 0 |
| SB6  0 | 0 | 0 | 0 | 1 | 0 | 0 | 1 | 1 |
| SB7  0 | 0 | 0 | 0 | 1 | 1 | 1 | 0 | 1 |

FIG. 8

CONFIGURING ITERATIVE ERROR CORRECTION PARAMETERS USING CRITERIA FROM PREVIOUS ITERATIONS

TECHNICAL FIELD

Embodiments of the disclosure relate generally to memory sub-systems, and more specifically, relate to configuring iterative error correction parameters using criteria from previous iterations in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a diagram illustrating a sense word-syndrome matrix used for configuring iterative error correction parameters in accordance with some embodiments of the present disclosure.

FIG. 5 is a diagram illustrating an updated sense word-syndrome matrix used for configuring iterative error correction parameters after one or more iterations in accordance with some embodiments of the present disclosure.

FIG. 8 is a diagram illustrating an updated sense word-syndrome matrix used for configuring iterative error correction parameters after one or more iterations in accordance with some embodiments of the present disclosure.

DETAILED DESCRIPTION

Figure 1:
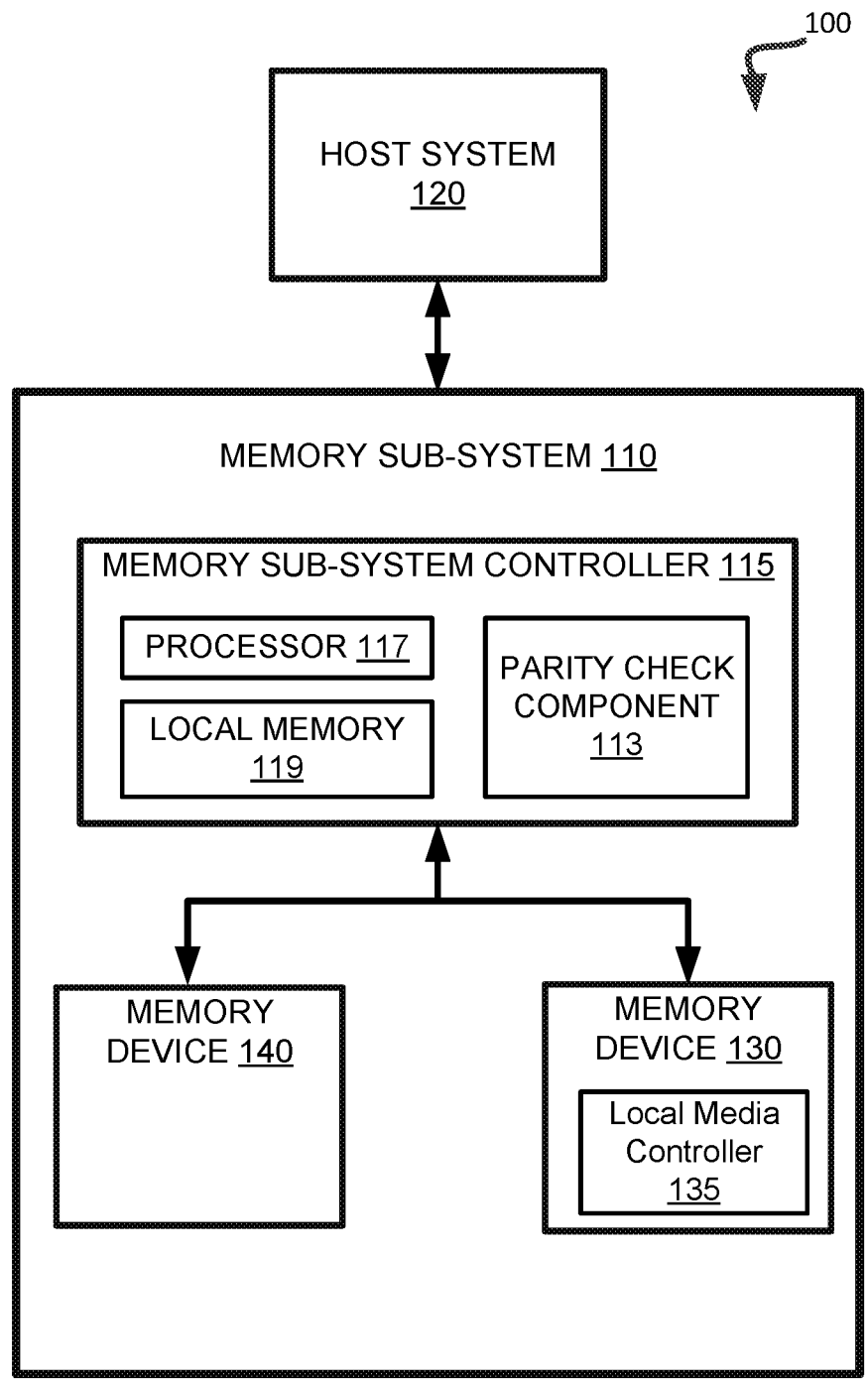
FIG. 1 illustrates an example computing system that includes a memory sub-system in accordance with some embodiments of the present disclosure.

Aspects of the present disclosure are directed to configuring iterative error correction parameters using criteria from previous iterations in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An example of a memory sub-system is a solid-state drive (SSD) that includes one or more non-volatile memory devices and a memory sub-system controller to manage the non-volatile memory devices. The memory sub-system controller can encode data into a format for storage at the memory device(s). For example, a class of error detection and correcting codes (ECC), such as low density parity check (LDPC) codes, can be used to encode the data. LDPC codes are capacity-approaching codes, which means that practical constructions exist which allow the error threshold to be set very close to a theoretical maximum. This error threshold defines an upper bound for errors in the data, up to which the probability of lost information can be made as small as desired. LDPC codes are reliable and highly efficient, making them useful in bandwidth-constrained applications. For example, encoded data written to physical memory cells of a memory device can be referred to as a codeword. The data read from the cells, which might include errors and differ from the codeword, can be referred to as a sense word. The sense word can include one or more of user data, error correcting code, metadata, or other information.

In performing error correcting code operations, including, as part of a read operation, encoded data stored on the storage device can be transmitted from the memory device to the memory sub-system controller. The memory sub-system controller can perform decoding operations to decode the encoded data into the original sequence of bits that were encoded for storage on the memory device. A number of bits of the decoded data received by the memory sub-system controller may have been flipped due to noise, interference, distortion, bit synchronization errors, or errors from the media itself (both intrinsic and extrinsic). For example, a bit that may have originally been stored as a 0 may be flipped to a 1 or vice versa.

Conventional memory sub-systems perform error correcting code operations to attempt to correct bit flip errors in a sense word read from the memory device. For example, a conventional memory sub-system can perform error correcting code operations on stored data to detect and correct errors in the encoded data. In many cases, the data is decoded using an iterative process. Segments of a data array can be decoded to produce a corresponding string of bits (e.g., a sense word).

Generally, the error correcting code capability of a conventional memory sub-system is a time and resource intensive process. The error correction process utilizes a number of parity check equations, each applicable to a subset of the bits of the sense word, which function together to identify bit flip errors in the sense word. In each iteration of a conventional error correction process, each bit of the sense word can be processed at least twice (e.g., using two or more passes over then entire sense word). For example, during a first pass, the memory sub-system controller can identify the energy associated with each bit of the sense word and identify a maximum energy associated with any one bit of the sense word. In one embodiment, the energy (also referred to herein as the energy level) associated with a given bit can be represented by a number of unsatisfied parity check equations associated with the bit. In another embodiment, the energy can be the number of unsatisfied parity check equations plus the XOR of the current bit value with its original value. A second pass over each bit of the sense word is then required to compare the energy for each bit to the identified maximum energy. The conventional error correction process can then include flipping those bits that have an energy that match the maximum energy, and moving on to a next iteration of the process. The need to process each bit of the sense word twice in order to identify those bits that should be flipped in a given iteration adds time and complexity to the conventional error correction process.

Aspects of the present disclosure address the above and other deficiencies by configuring iterative error correction parameters using criteria from previous iterations or partial iterations in a memory sub-system. In one embodiment, a parity check component of a memory sub-system controller reads a sense word from a memory device of the memory sub-system and executes a number of parity check equations on corresponding subsets of the sense word. In one embodiment, each of the parity check equations corresponds to a different subset of the bits of the sense word, although different subsets can share one or more bits. Each parity check equation generates a parity check equation result which indicates whether a number of bits set to a value of '1' in the corresponding subset of the sense word is even or odd. In one embodiment, if the number of bits set to a value of '1' in the corresponding subset is even, the parity check equation result is said to be in a satisfied state (i.e., a state indicating that there are no errors in the corresponding subset of the sense word) and if the number of bits set to a value of '1' in the corresponding subset is odd, the parity check equation result is said to be in an unsatisfied state (i.e., a state indicating that there are errors in the corresponding subset of the sense word). Since any one bit of the sense word can be part of multiple different subsets, that bit can contribute to or be associated with multiple parity check equation results. In one embodiment, the parity check component logically combines all of the parity check equation results to determine a syndrome for the sense word. If the syndrome for the sense word does not satisfy a codeword criterion (e.g., does not indicate that all of the parity check equation results are in a satisfied state), the parity check component determines that there are one or more errors in the sense word and initiates an iterative LDPC correction process. Once the parity check component begins flipping bits in the sense word, the sequence of bits can be referred to as a corrected word. In one embodiment, each iteration after a first iteration, or at least one iteration after the first iteration, uses some criterion based at least partially on a previous iteration of the LDPC correction process. That criterion is used to determine which bits of the corrected word to flip (i.e., to change from a '1' to a '0' or vice versa) and can include, for example, a maximum energy for any one bit of the corrected word from the previous iteration (i.e., the iteration performed immediately before a current iteration). The parity check component can perform multiple iterations of the LDPC correction process until the syndrome for the corrected word satisfies the codeword criterion, or until a threshold number of iterations is reached.

Other aspects of the present disclosure address the above and other deficiencies by implementing iterative error correction with adjustable parameters after a threshold number of iterations. In one embodiment, the parity check component of a memory sub-system controller reads a sense word from a memory device of the memory sub-system and executes a number of parity check equations on corresponding subsets of the sense word. Each parity check equation generates a parity check equation result which indicates whether a number of bits set to a value of '1' in the corresponding subset of the sense word is even or odd. If the syndrome for the sense word does not satisfy a codeword criterion (e.g., does not indicate that all of the parity check equation results are in a satisfied state), the parity check component determines that there are one or more errors in the sense word and initiates an iterative LDPC correction process with adjustable parameters after a threshold number of iterations. In one embodiment, a first threshold number of iterations is initially performed using a first criterion based at least partially on a previous iteration of the LDPC correction process (e.g., one less than a maximum number of parity check equation results that are in the unsatisfied state for any one bit of the sense word or corrected word from the previous iteration). For any iterations performed after the first threshold number of iterations has been reached, the LDPC correction process can use a second criterion, which is also based at least partially on a previous iteration of the LDPC correction process, but can be different than the first criterion. For example, the second criterion can include a maximum number of parity check equation results that are in the unsatisfied state for any one bit of the corrected word from the previous iteration. The parity check component can perform multiple iterations of the LDPC correction process until the syndrome for the corrected word satisfies the codeword criterion, or until a second threshold number of iterations is reached. Additional details of the parity check component and the iterative LDPC correction process are described below.

By configuring iterative error correction parameters using criteria from previous iterations or using adjustable parameters after a threshold number of iterations, the number of times that each bit of the sense word is processed (i.e., the number of passes over each bit of the sense word) can be reduced from two or more to only one in the error correction process. For example, during the single pass, the memory sub-system controller can identify a number of unsatisfied parity check equation results associated with each bit of the sense word and identify any bits of the sense word for which that number of unsatisfied parity check equations is equal to the maximum number of parity check equation results that are in the unsatisfied state for any one bit of the sense word from the previous iteration. In one embodiment, the memory sub-system controller flips those bits and moves on to the next iteration of the process without having to make a second pass over the sense word. This reduces the time and complexity of the parity check and error correction processes, thereby freeing resources of the memory sub-system controller to perform other operations. In addition, the techniques described herein can result in the correction of errors being completed in fewer iterations and fewer errors being rendered uncorrectable. Furthermore, although the iterative error correction techniques are described herein in the context of reading data stored in a memory sub-system, it should be appreciated that these same techniques are also applicable to other implementations. For example, in an optical communication system, it may be desirable to verify whether the data received matches the data transmitted. If errors are identified in the received data, the iterative error correction techniques described herein can be applied to correct those errors. Advantages similar to those described above can be realized in any number of different implementations of these techniques.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In one embodiment, the memory sub-system 110 includes a parity check component 113 that can configure iterative error correction parameters using criteria from previous iterations or partial iterations in memory sub-system 110. In one embodiment, responsive to the syndrome for a sense word read from one of memory devices 130 or 140 not satisfying the codeword criterion (e.g., one or more of the parity check equation results being in an unsatisfied state), parity check component can perform an iterative LDPC correction process. In one embodiment, parity check component 113 determines a number of parity check equation results that are in an unsatisfied state for each bit of the sense word and determines a maximum number of parity check equation results that are in the unsatisfied state for any one bit of the sense word. If the current iteration is the first iteration of the iterative LDPC correction process, parity check component 113 can flip any bits in the sense word having a level of energy (e.g., a threshold number of parity check equation results that are in the unsatisfied state) that satisfies an energy threshold condition (e.g., is greater than or equal to a threshold level of energy), and flip each of the parity check equation results associated with those bits. In one embodiment, the threshold level of energy is equal to the maximum energy (e.g., the maximum number of parity check equation results that are in the unsatisfied state) for any one bit of the sense word. If the current iteration is not the first iteration, parity check component 113 can flip any bits in the sense word having energy equal to the maximum energy for any one bit of the corrected word from the previous iteration, and flip each of the parity check equation results associated with those bits. Parity check component 113 further determines whether a number of iterations performed in the iterative LDPC correction process satisfies an iteration criterion (e.g., is less than a threshold number of iterations), and if so continues the LDPC correction process by moving on to a next iteration. In response to the number of iterations performed not satisfying the iteration criterion (e.g., meeting or exceeding the threshold number of iterations), parity check component 113 can end the LDPC correction process. Thus, in at least one iteration after the first iteration (e.g., each iteration after the first iteration), parity check component 113 uses a criterion based at least partially on a previous iteration or partial iteration of the LDPC correction process. For example, the second iteration can use a criterion based on the first iteration, the third iteration can use a criterion based on the second iteration, and so on. Depending on the embodiment, the energy of a given bit can represent a number of unsatisfied parity check equations associated with the bit or the number of unsatisfied parity check equations plus the XOR of the current bit value with its original value (e.g., before the first iteration).

In another embodiment, parity check component 113 determines the number of parity check equation results that are in an unsatisfied state for each bit of the sense word and determines a maximum number of parity check equation results that are in the unsatisfied state for any one bit of the sense word. If the current iteration is one of a threshold number of iterations after the first iteration of the iterative LDPC correction process (e.g., is one of the first 3 or 4 iterations after the first iteration), parity check component 113 can flip any bits in the sense word or corrected word having a number of parity check equation results that are in the unsatisfied state greater than or equal to one less than the maximum number of parity check equation results that are in the unsatisfied state for any one bit of the sense word or corrected word from the previous iteration, and flip each of the parity check equation results associated with those bits. If the current iteration is one after the threshold number of iterations (e.g., is not one of the first 3 or 4 iterations after the first iteration), parity check component 113 can flip any bits in the corrected word having a number of parity check equation results that are in the unsatisfied state equal to the maximum number of parity check equation results that are in the unsatisfied state for any one bit of the corrected word from the previous iteration, and flip each of the parity check equation results associated with those bits. Parity check component 113 further determines whether a number of iterations performed in the iterative LDPC correction process satisfies an iteration criterion (e.g., is less than a threshold number of iterations), and if so continues the LDPC correction process by moving on to a next iteration. In response to the number of iterations performed not satisfying the iteration criterion (e.g., meeting or exceeding the threshold number of iterations), parity check component 113 can end the LDPC correction process. Thus, after a threshold number of iterations, parity check component 113 can adjust the criteria used to determine whether to flip a given bit of the corrected word based at least partially on a previous iteration of the LDPC correction process. Further details with regards to the operations of parity check component 113 are described below.

Figure 2:
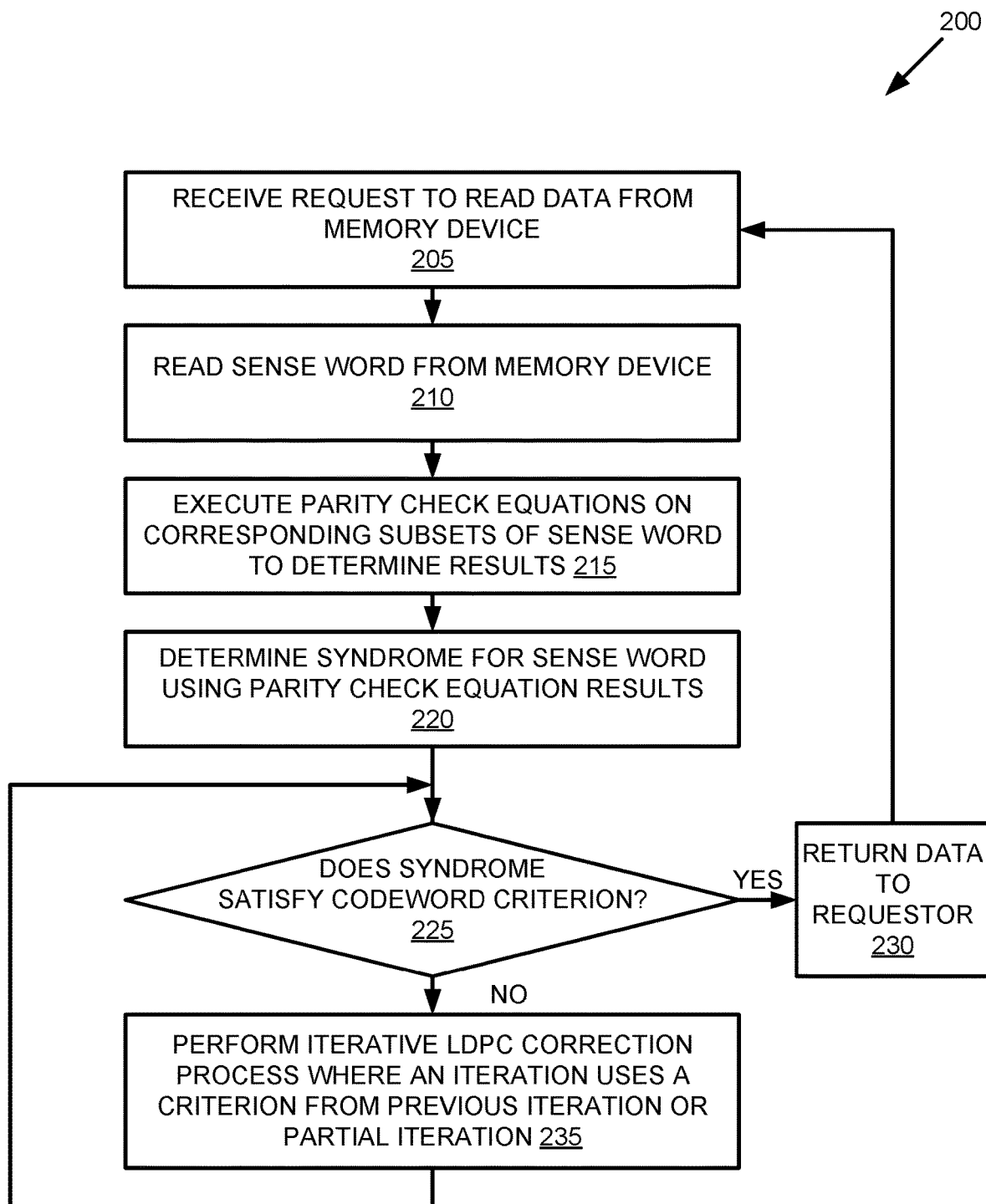
FIG. 2 is a flow diagram of an example method of configuring iterative error correction parameters using criteria from previous iterations in accordance with some embodiments of the present disclosure.

FIG. 2 is a flow diagram of an example method of configuring iterative error correction parameters using criteria from previous iterations in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by parity check component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing logic receives, from a requestor, a request to read data from a memory device, such as memory device 130. In one embodiment, memory sub-system controller 115 receives the request from host system 120 or from some other component connected to or within memory sub-system 110. The request may identify data to be read from memory device 130 of memory sub-system 110.

At operation 210, the processing logic reads a sense word from the memory device 130. In one embodiment, the sense word includes a sequence of bits representing the data requested at operation 205. In one embodiment, parity check component 113 identifies a physical address in memory device 130 where the requested data is stored, reads the sense word from memory device 130, and temporarily stores the sense word in a buffer or other storage location while parity check and/or error correction processes can be performed. An example sense word 310 is shown in FIG. 3. Sense word 310 is illustrated as including a sequence of eight sense word bits (i.e., SWB0-SWB7), although it should be understood that this is merely an example used for illustrative purposes. In other embodiments, the sense word can include any number of bits, such as several thousand bits (e.g., 36k bits).

At operation 215, the processing logic executes a number of parity check equations on corresponding subsets of the sense word. In one embodiment, each of the parity check equations corresponds to a different subset of the bits of the sense word, although different subsets can share one or more bits. For example, in one embodiment, a subset can include 40 bits out of the 36k bits in the sense word. There could be, for example, several thousand (e.g., 3k) parity check equations each configured to operate on a different subset of 40 bits. Each parity check equation generates a parity check equation result which indicates whether a number of bits set to a value of '1' in the corresponding subset of the sense word is even or odd. In one embodiment, if the number of bits set to a value of '1' in the corresponding subset is even, the parity check equation result is said to be in a satisfied state and if the number of bits set to a value of '1' in the corresponding subset is odd, the parity check equation result is said to be in an unsatisfied state. In another embodiment, these values (i.e., logic states) can be reversed. Since any one bit of the sense word can be part of multiple different subsets, that bit can contribute to or be associated with multiple parity check equation results. In one embodiment, each bit of the sense word is part of the same number of subsets used by the parity check equations (e.g., 4 subsets).

At operation 220, the processing logic determines a syndrome for the sense word using the determined parity check equation results. In one embodiment, parity check component 113 logically combines the parity check equation results to determine the syndrome, such as by appending or concatenating the parity check equation results. An example syndrome 320 is shown in FIG. 3. Syndrome 320 is illustrated as including a sequence of eight syndrome bits (i.e., SB0-SB7), although it should be understood that this is merely an example used for illustrative purposes. In other embodiments, the syndrome can include any number of bits, such as several thousand bits (e.g., 3k bits).

FIG. 3 is a block diagram illustrating a sense word-syndrome matrix 300 used for configuring iterative error correction parameters in accordance with some embodiments of the present disclosure. As described above, sense word 310 includes a number of bits read from a memory device and syndrome 320 includes a number of bits representing parity check equation results. In the illustrated example, there are eight parity check equations each corresponding to a different subset of the bits of sense word 310. For example, a first subset represented by SB0 includes SWB0, SWB1, SWB2, and SWB4. A second subset represented by SB1 includes SWB0, SWB1, SWB2, and SWB5. A third subset represented by SB2 includes SWB0, SWB1, SWB2, and SWB6. There are additional subsets represented by each bit of syndrome 320. In the matrix 300, a value of '1' can indicate that a given bit of sense word 310 is part of a subset represented by a bit of syndrome 320, while a value of '0' can indicated that the bit of sense word 310 is not a part of the subset.

In one embodiment, the parity check equations each identify the logical state of the bits of sense word 310 that are part of each corresponding subset, sums those bits together and determines whether the result is even or odd. In other words, each parity check equations determines whether the number of bits of the sense word 310 that are part of a corresponding subset and have a certain logical state is even or odd. For example, parity check component 113 can determine whether a number of bits set to a logical value of '1' in a corresponding subset of the sense word 310 is even or odd. In one embodiment, if the number of bits set to a logical value of '1' in a corresponding subset of the sense word 310 is even, the parity check equation result can be '0' indicating that the parity check equation is satisfied. If the number of bits set to a logical value of '1' in a corresponding subset of the sense word 310 is odd, the parity check equation result can be '1' indicating that the parity check equation is unsatisfied. Each bit of syndrome 320 represents one of these parity check equation results. Thus, for SB0, since SWB0 is set to a value '1', SWB1 is set to a value of '0', SWB2 is set to a value of '1', and SWB4 is set to a value of '0', there are two bits of sense word 310 in the corresponding subset that are set to a value of '1'. Two bits is even, so the parity check equation result represented by SB0 is '0' indicating that the corresponding parity check equation is satisfied. For SB2, for example, since SWB0 is set to a value '1', SWB1 is set to a value of '0', SWB2 is set to a value of '1', and SWB6 is set to a value of '1', there are three bits of sense word 310 in the corresponding subset that are set to a value of '1'. Three bits is odd, so the parity check equation result represented by SB0 is '1' indicating that the corresponding parity check equation is unsatisfied.

Referring again to FIG. 2, at operation 225, the processing logic determines whether the syndrome for the sense word satisfies an LDPC check criterion. In one embodiment, parity check component 113 determines whether all of the parity check equation results in the syndrome are in a satisfied state (e.g., have a value of '0'). In one embodiment, if all of the parity check equation results in the syndrome are in a satisfied state, parity check component 113 determines that the syndrome satisfies the LDPC check criterion. Conversely, if all of the parity check equation results in the syndrome are not in a satisfied state (e.g., one or more have a value of '1'), parity check component 113 determines that the syndrome does not satisfy the LDPC check criterion. If the syndrome for the sense word does satisfy the codeword criterion, parity check component 113 determines that there are no errors in the sense word and, at operation 230, returns the sense word to the requestor as the requested data.

If, however, the syndrome for the sense word does not satisfy the codeword criterion, the parity check component 113 determines that there are one or more errors in the sense word and, at operation 235, performs an iterative LDPC correction process. In one embodiment, at least one iteration after a first iteration uses a criterion based at least partially on a previous iteration or partial iteration of the LDPC correction process. That criterion is used to determine which bits of the corrected word to flip (i.e., to change from a '1' to a '0' or vice versa) and can include, for example, a maximum number of parity check equation results that are in the unsatisfied state for any one bit of the corrected word from the previous full iteration (i.e., the iteration performed immediately before a current iteration). In another embodiment, the criterion can be based on a partial iteration. For example, if a full iteration includes examining 2000 bits, the maximum number of parity check equation results (or the maximum energy) energy can be determined from only 1000 of those bits (i.e., one half of an iteration) or some other fraction (e.g., one third, one quarter, etc.). If, in the current iteration, parity check component 113 has already examined a certain fraction of the bits that make up a full iteration, the bits from this partial iteration of the current iteration can be used for the criterion. Parity check component 113 can perform multiple iterations of the LDPC correction process until the syndrome for the corrected word satisfies the codeword criterion at operation 225, or until a threshold number of iterations is reached. Additional details of the iterative LDPC correction process are described below with respect to FIG. 4.

Figure 4:
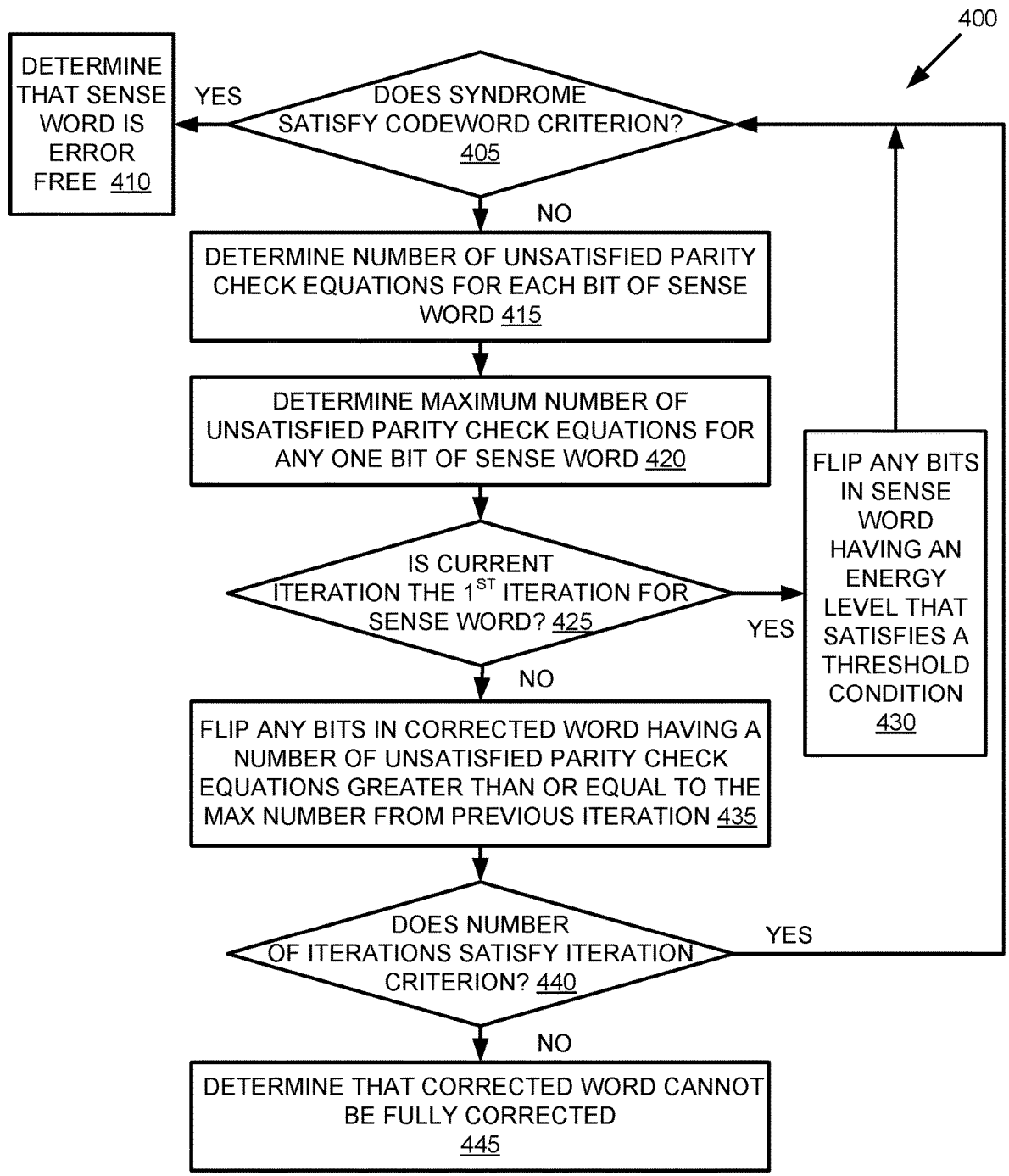
FIG. 4 is a flow diagram of an example method of an iterative error correction process where one or more parameters are configured using criteria from previous iterations in accordance with some embodiments of the present disclosure.

FIG. 4 is a flow diagram of an example method of an iterative error correction process where one or more parameters are configured using criteria from previous iterations in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by parity check component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing logic determines whether the syndrome for a sense word satisfies an LDPC check criterion. If the syndrome for the sense word does satisfy the codeword criterion, at operation 410, the processing logic determines that there are no errors in the sense word. If, however, the syndrome for the sense word does not satisfy the codeword criterion, the parity check component 113 determines that there are one or more errors in the sense word and initiates an iterative LDPC correction process. The iterative LDPC correction process can include a number of iterations, beginning with a first iteration and continuing to one or more subsequent iterations.

At operation 415, the processing logic determines a number of parity check equations results that are in an unsatisfied state for each bit of the sense word. Using the example above and illustrated in FIG. 3, SWB0 of sense word 310 is part of the subsets corresponding to SB0, SB1, SB2, and SB3 of syndrome 320, SWB1 of sense word 310 is part of the subsets corresponding to SB0, SB1, SB2, and SB4 of syndrome 320, and SWB7 of sense word 310 is part of the subsets corresponding to SB3, SB5, SB6, and SB7 of syndrome 320. The additional bits of sense word 310 are part of different subsets represented by each bit of syndrome 320. For SWB0, since SB0 is set to a value of '0', SB1 is set to a value of '0', SB2 is set to a value of '1', and SB3 is set to a value of '1', there are two bits of syndrome 320 that are set to a value of '1' indicating corresponding parity check equation results in the unsatisfied state. For SWB1, since SB0 is set to a value of '0', SB1 is set to a value of '0', SB2 is set to a value of '1', and SB4 is set to a value of '0', there is one bit of syndrome 320 that is set to a value of '1' indicating a corresponding parity check equation result in the unsatisfied state. For SWB7, since SB3 is set to a value of '1', SB5 is set to a value of '1', SB6 is set to a value of '0', and SB7 is set to a value of '1', there are three bits of syndrome 320 that are set to a value of '1' indicating corresponding parity check equation results in the unsatisfied state. In another embodiment, the processing logic determines the energy for each bit of the sense word. Depending on the embodiment, the energy of a given bit can represent a number of unsatisfied parity check equations associated with the bit or the number of unsatisfied parity check equations plus the XOR of the current bit value with its original value.

At operation 420, the processing logic determines a maximum number of parity check equation results that are in the unsatisfied state for any one bit of the sense word. Since SWB0 had two unsatisfied parity check equations, SWB1 had one unsatisfied parity check equation, and SWB7 had three unsatisfied parity check equations, parity check component 113 can determine that the maximum number is three unsatisfied parity check equations in the current iteration. Parity check component 113 can store (e.g., in local memory 119 or elsewhere in memory sub-system 110) an indication of this maximum number for use in subsequent iterations. In another embodiment, the processing logic determines the maximum energy for any one bit of the sense word.

At operation 425, the processing logic determines whether a current iteration of the LDPC correction process is the first iteration. If the current iteration is the first iteration, at operation 430, the processing logic flips any bits in the sense word having a number of parity check equation results that are in the unsatisfied state (or an energy level) that satisfies an energy threshold condition, and flips each of the parity check equation results associated with those bits. In one embodiment, the energy threshold condition is satisfied when the energy level is greater than or equal to a threshold level of energy. In one embodiment, the threshold level of energy is equal to the maximum number of parity check equation results that are in the unsatisfied state for any one bit of the sense word, as determined at operation 425. Thus, in the example above, parity check component 113 can flip the value of SWB7 of sense word 310 from a '0' to a '1' and flip the values of SB3, SB5, SB6, and SB7 of syndrome 320. The resulting matrix 500 is illustrated in FIG. 5. As illustrated, SWB7 of sense word 510 has a value of '1', SB3 of syndrome 520 has a value of '0', SB5 has a value of '0', SB6 has a value of '1', and SB7 has a value of '0'. Upon flipping the bits at operation 430, the processing logic returns to operation 405 and determines whether the updated syndrome satisfies the codeword criterion.

If, however, the processing logic determines at operation 425 that the current iteration is not the first iteration, at operation 435, the processing logic flips any bits in the corrected word having a number of parity check equation results that are in the unsatisfied state (or energy) that are greater than or equal to the maximum number of parity check equation results that are in the unsatisfied state for any one bit of the corrected word from the previous iteration (or the maximum energy), and flips each of the parity check equation results associated with those bits. In one embodiment, parity check component 113 examines the number of unsatisfied parity check equation results from updated syndrome 520 for each bit of corrected word 510 and compares them to the maximum number of unsatisfied parity check equation results from the previous iteration (e.g., 3), as determined at operation 420. Parity check component 113 can flip any identified bits in the corrected word 510. If there are no such identified bits in the corrected word 510, then no bits are flipped in the current iteration.

At operation 440, the processing logic determines whether a number of iterations performed in the iterative LDPC correction process satisfies an iteration criterion (e.g., is less than a threshold number of iterations). In one embodiment, parity check component 113 maintains a counter which is incremented after each iteration is performed. Parity check component 113 can compare the value of the counter to a threshold value (e.g., 30) to determine if the iteration criterion is satisfied. If the number of iterations does satisfy the iteration criterion, the processing logic continues the LDPC correction process by determining whether the updated syndrome satisfies the codeword criterion and moving on to a next iteration. If, however, the number of iterations performed does not satisfy the iteration criterion (e.g., the number of iterations meets or exceeds the threshold number of iterations), parity check component 113 can determine, at operation 445, that the corrected word cannot be fully corrected and end the LDPC correction process.

Figure 6:
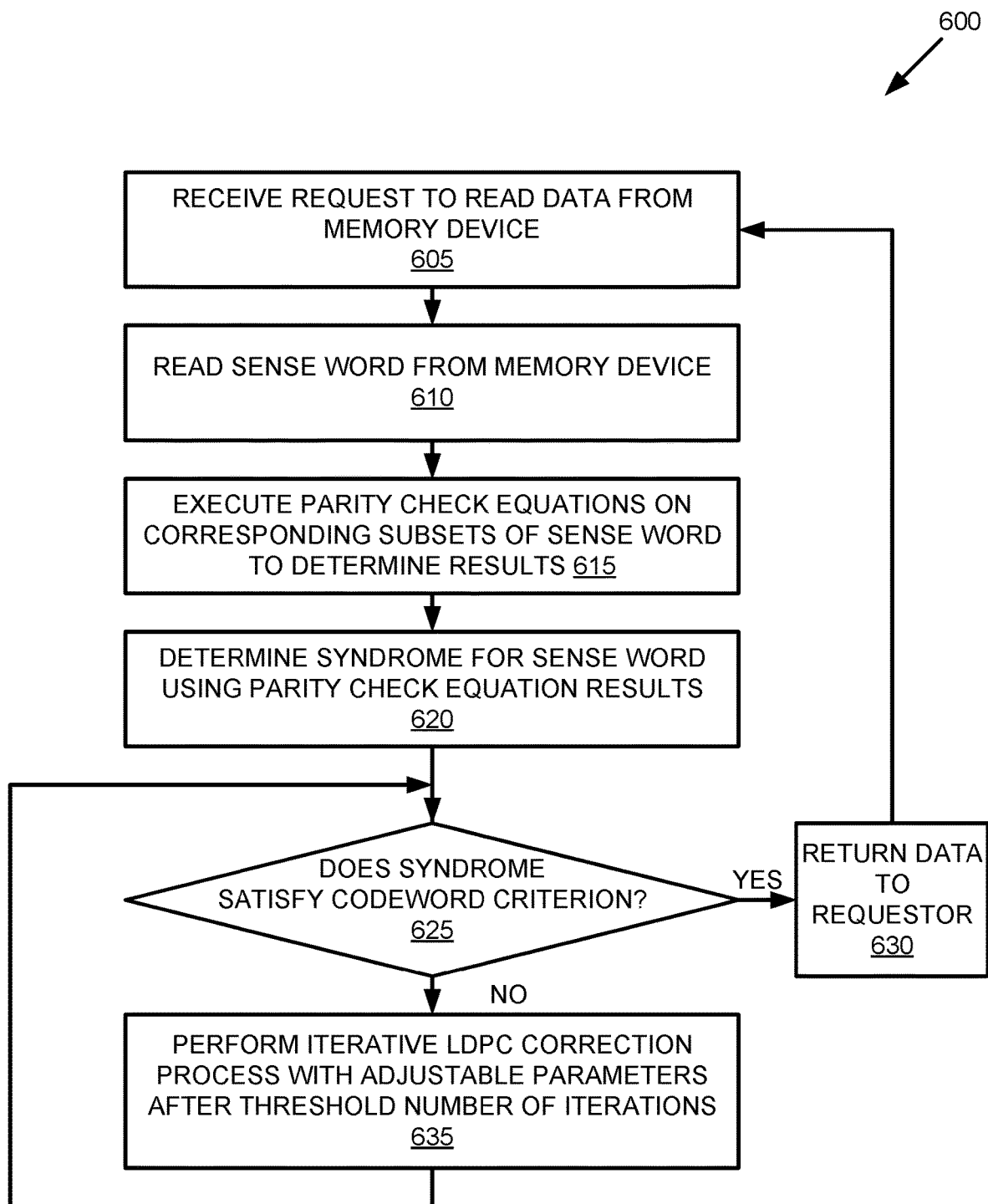
FIG. 6 is a flow diagram of an example method of iterative error correction with adjustable parameters after a threshold number of iterations in accordance with some embodiments of the present disclosure.

FIG. 6 is a flow diagram of an example method of iterative error correction with adjustable parameters after a threshold number of iterations in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by parity check component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing logic receives, from a requestor, a request to read data from a memory device, such as memory device 130. In one embodiment, memory sub-system controller 115 receives the request from host system 120 or from some other component connected to or within memory sub-system 110. The request may identify data to be read from memory device 130 of memory sub-system 110.

At operation 610, the processing logic reads a sense word from the memory device 130. In one embodiment, the sense word includes a sequence of bits representing the data requested at operation 205. In one embodiment, parity check component 113 identifies a physical address in memory device 130 where the requested data is stored, reads the sense word from memory device 130, and temporarily stores the sense word in a buffer or other storage location while parity check and/or error correction processes can be performed. An example sense word 310 is shown in FIG. 3. Sense word 310 is illustrated as including a sequence of eight sense word bits (i.e., SWB0-SWB7), although it should be understood that this is merely an example used for illustrative purposes. In other embodiments, the sense word can include any number of bits, such as several thousand bits (e.g., 36k bits).

At operation 615, the processing logic executes a number of parity check equations on corresponding subsets of the sense word. In one embodiment, each of the parity check equations corresponds to a different subset of the bits of the sense word, although different subsets can share one or more bits. For example, in one embodiment, a subset can include 40 bits out of the 36k bits in the sense word. There could be for example, several thousand (e.g., 3k) parity check equations each configured to operate on a different subset of 40 bits. Each parity check equation generates a parity check equation result which indicates whether a number of bits set to a value of '1' in the corresponding subset of the sense word is even or odd. In one embodiment, if the number of bits set to a value of '1' in the corresponding subset is even, the parity check equation result is said to be in a satisfied state and if the number of bits set to a value of '1' in the corresponding subset is odd, the parity check equation result is said to be in an unsatisfied state. In another embodiment, these values (i.e., logic states) can be reversed. Since any one bit of the sense word can be part of multiple different subsets, that bit can contribute to or be associated with multiple parity check equation results. In one embodiment, each bit of the sense word is part of the same number of subsets used by the parity check equations (e.g., 4 subsets).

At operation 620, the processing logic determines a syndrome for the sense word using the determined parity check equation results. In one embodiment, parity check component 113 logically combines the parity check equation results to determine the syndrome, such as by appending or concatenating the parity check equation results. An example syndrome 320 is shown in FIG. 3. Syndrome 320 is illustrated as including a sequence of eight syndrome bits (i.e., SB0-SB7), although it should be understood that this is merely an example used for illustrative purposes. In other embodiments, the syndrome can include any number of bits, such as several thousand bits (e.g., 3k bits).

At operation 625, the processing logic determines whether the syndrome for the sense word satisfies an LDPC check criterion. In one embodiment, parity check component 113 determines whether all of the parity check equation results in the syndrome are in a satisfied state (e.g., have a value of '0'). In one embodiment, if all of the parity check equation results in the syndrome are in a satisfied state, parity check component 113 determines that the syndrome satisfies the LDPC check criterion. Conversely, if all of the parity check equation results in the syndrome are not in a satisfied state (e.g., one or more have a value of '1'), parity check component 113 determines that the syndrome does not satisfy the LDPC check criterion. If the syndrome for the sense word does satisfy the codeword criterion, parity check component 113 determines that there are no errors in the sense word and, at operation 630, returns the sense word to the requestor as the requested data.

If, however, the syndrome for the sense word does not satisfy the codeword criterion, the parity check component 113 determines that there are one or more errors in the sense word and, at operation 635, performs an iterative LDPC correction process. In one embodiment, each iteration for a first threshold number of iterations after a first iteration uses a first criterion based at least partially on a previous iteration of the LDPC correction process. That criterion is used to determine which bits of the corrected word to flip (i.e., to change from a '1' to a '0' or vice versa) and can include, for example, one less than a maximum number of parity check equation results that are in the unsatisfied state for any one bit of the corrected word from the previous iteration (i.e., the iteration performed immediately before a current iteration). For any iterations performed after the first threshold number of iterations has been reached, the LDPC correction process can use a second criterion, which is also based at least partially on a previous iteration of the LDPC correction process, but can be different than the first criterion. For example, the second criterion can include maximum number of parity check equation results that are in the unsatisfied state for any one bit of the corrected word from the previous iteration.

Parity check component 113 can perform multiple iterations of the LDPC correction process until the syndrome for the corrected word satisfies the codeword criterion at operation 225, or until a second threshold number of iterations is reached. Additional details of the iterative LDPC correction process are described below with respect to FIG. 7.

Figure 7:
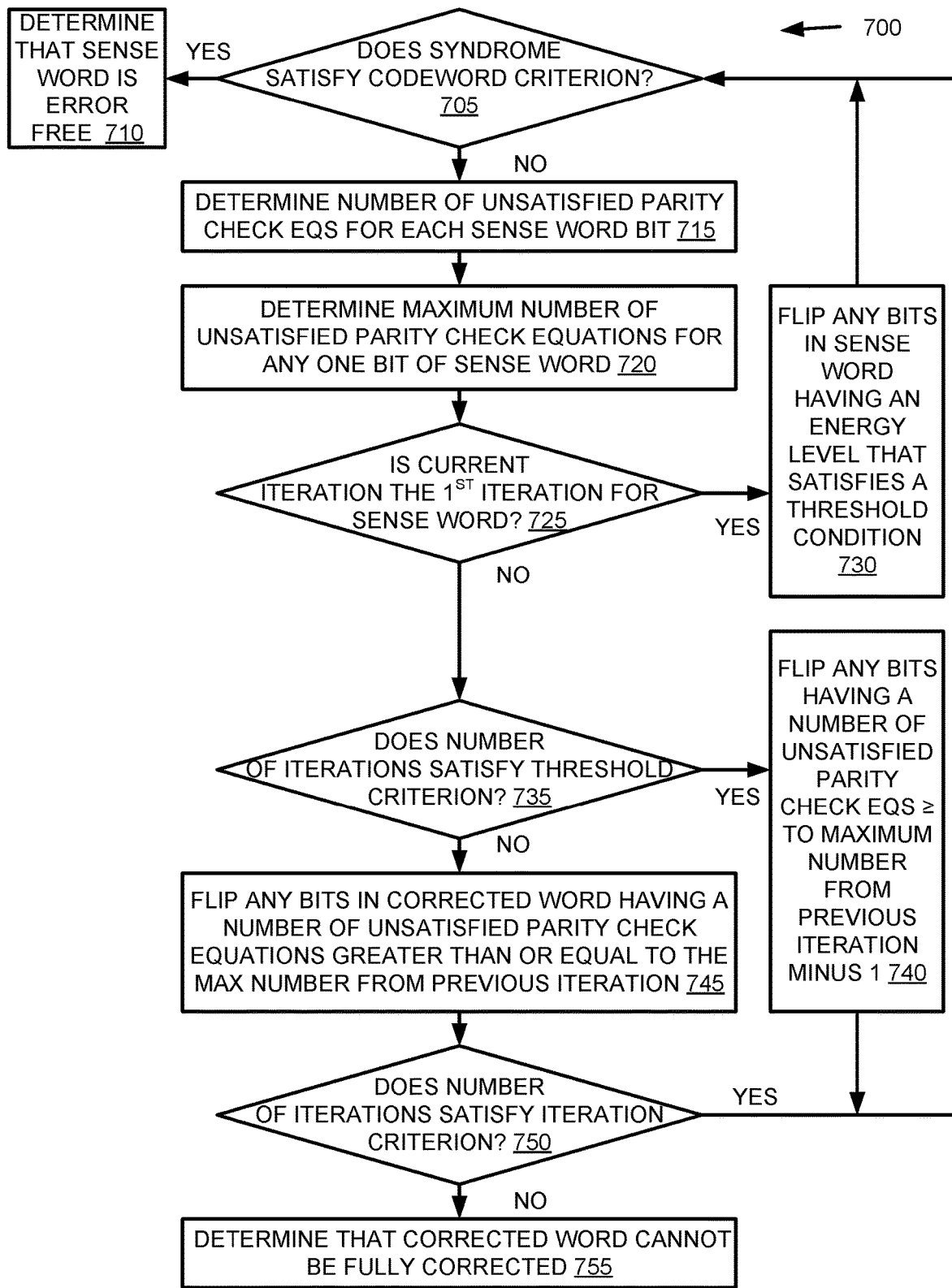
FIG. 7 is a flow diagram of an example method of an iterative error correction process where one or more parameters are adjusted after a threshold number of iterations in accordance with some embodiments of the present disclosure.

FIG. 7 is a flow diagram of an example method of an iterative error correction process where one or more parameters are adjusted after a threshold number of iterations in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by parity check component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, the processing logic determines whether the syndrome for a sense word satisfies an LDPC check criterion. If the syndrome for the sense word does satisfy the codeword criterion, at operation 410, the processing logic determines that there are no errors in the sense word. If, however, the syndrome for the sense word does not satisfy the codeword criterion, the parity check component 113 determines that there are one or more errors in the sense word and initiates an iterative LDPC correction process. The iterative LDPC correction process can include a number of iterations, beginning with a first iteration and continuing to one or more subsequent iterations.

At operation 715, the processing logic determines a number of parity check equations results that are in an unsatisfied state for each bit of the sense word. Using the example above and illustrated in FIG. 3, SWB0 of sense word 310 is part of the subsets corresponding to SB0, SB1, SB2, and SB3 of syndrome 320, SWB1 of sense word 310 is part of the subsets corresponding to SB0, SB1, SB2, and SB4 of syndrome 320, and SWB7 of sense word 310 is part of the subsets corresponding to SB3, SB5, SB6, and SB7 of syndrome 320. The additional bits of sense word 310 are part of different subsets represented by each bit of syndrome 320. For SWB0, since SB0 is set to a value of '0', SB1 is set to a value of '0', SB2 is set to a value of '1', and SB3 is set to a value of '1', there are two bits of syndrome 320 that are set to a value of '1' indicating corresponding parity check equation results in the unsatisfied state. For SWB1, since SB0 is set to a value of '0', SB1 is set to a value of '0', SB2 is set to a value of ' 1', and SB4 is set to a value of '0', there is one bit of syndrome 320 that is set to a value of '1' indicating a corresponding parity check equation result in the unsatisfied state. For SWB7, since SB3 is set to a value of '1', SB5 is set to a value of '1', SB6 is set to a value of '0', and SB7 is set to a value of '1', there are three bits of syndrome 320 that are set to a value of '1' indicating corresponding parity check equation results in the unsatisfied state. In another embodiment, the processing logic determines the energy for each bit of the sense word. Depending on the embodiment, the energy of a given bit can represent a number of unsatisfied parity check equations associated with the bit or the number of unsatisfied parity check equations plus the XOR of the current bit value with its original value.

At operation 720, the processing logic determines a maximum number of parity check equation results that are in the unsatisfied state for any one bit of the sense word. Since SWB0 had two unsatisfied parity check equations, SWB1 had one unsatisfied parity check equation, and SWB7 had three unsatisfied parity check equations, parity check component 113 can determine that the maximum number is three unsatisfied parity check equations in the current iteration. Parity check component 113 can store (e.g., in local memory 119 or elsewhere in memory sub-system 110) an indication of this maximum number for use in subsequent iterations. In another embodiment, the processing logic determines the maximum energy for any one bit of the sense word.

At operation 725, the processing logic determines whether a current iteration of the LDPC correction process is the first iteration. If the current iteration is the first iteration, at operation 730, the processing logic flips any bits in the sense word having a number of parity check equation results that are in the unsatisfied state (or an energy level) that satisfies an energy threshold condition, and flips each of the parity check equation results associated with those bits. In one embodiment, the energy threshold condition is satisfied when the energy level is greater than or equal to a threshold level of energy. In one embodiment, the threshold level of energy is equal to the maximum number of parity check equation results that are in the unsatisfied state for any one bit of the sense word, as determined at operation 425. Thus, in the example above, parity check component 113 can flip the value of SWB7 of sense word 310 from a '0' to a '1' and flip the values of SB3, SB5, SB6, and SB7 of syndrome 320. The resulting matrix 500 is illustrated in FIG. 5. As illustrated, SWB7 of sense word 510 has a value of '1', SB3 of syndrome 520 has a value of '0', SB5 has a value of '0', SB6 has a value of '1', and SB7 has a value of '0'. Upon flipping the bits at operation 730, the processing logic returns to operation 705 and determines whether the updated syndrome satisfies the codeword criterion.

If, however, the processing logic determines at operation 725 that the current iteration is not the first iteration, at operation 735, the processing logic the processing logic determines whether a number of iterations performed in the iterative LDPC correction process satisfies an adjustment threshold criterion (e.g., is less than an adjustment threshold number of iterations). In one embodiment, parity check component 113 maintains a counter which is incremented after each iteration is performed. Parity check component 113 can compare the value of the counter to an adjustment threshold value (e.g., 3 or 4) to determine if the adjustment threshold criterion is satisfied.

If the number of iterations does satisfy the adjustment threshold criterion, at operation 740, the processing logic flips any bits in the sense word having a number of parity check equation results that are in the unsatisfied state that are greater than or equal to one less than the maximum number of parity check equation results that are in the unsatisfied state for any one bit of the sense word from the previous iteration (or a threshold energy level), and flips each of the parity check equation results associated with those bits. Since the maximum number of unsatisfied parity check equations from the previous iteration determined at operation 720 was three, parity check component can look for any bits of sense word 510 that have a number of unsatisfied checks equal to two (i.e., =3-1). Thus, in the example above, parity check component 113 can flip the value of SWB6 of sense word 510 from a '0' to a '1' and flip the values of SB2, SB3, SB4, and SB6 of syndrome 520. The resulting matrix 800 is illustrated in FIG. 8. As illustrated, SWB6 of corrected word 810 has a value of '0', SB2 of syndrome 820 has a value of '0', SB3 has a value of '1', SB4 has a value of '1', and SB6 has a value of '0'. In other embodiments, some other criteria can be used, such as two less, three less, etc., than the maximum number of unsatisfied parity check equations from the previous iteration. Upon flipping the bits at operation 740, the processing logic returns to operation 705 and determines whether the updated syndrome satisfies the codeword criterion.

If, however, the number of iterations performed does not satisfy the adjustment threshold criterion (e.g., the number of iterations meets or exceeds the adjustment threshold number of iterations), at operation 745, the processing logic flips any bits in the corrected word having a number of parity check equation results that are in the unsatisfied state (or energy) that are greater than or equal to the maximum number of parity check equation results that are in the unsatisfied state for any one bit of the corrected word from the previous iteration (or the maximum energy), and flips each of the parity check equation results associated with those bits.

At operation 750, the processing logic determines whether a number of iterations performed in the iterative LDPC correction process satisfies an iteration criterion (e.g., is less than a threshold number of iterations). In one embodiment, parity check component 113 maintains a counter which is incremented after each iteration is performed. Parity check component 113 can compare the value of the counter to a threshold value (e.g., 30) to determine if the iteration criterion is satisfied. If the number of iterations does satisfy the iteration criterion, the processing logic continues the LDPC correction process by determining whether the updated syndrome satisfies the codeword criterion and moving on to a next iteration. If, however, the number of iterations performed does not satisfy the iteration criterion (e.g., the number of iterations meets or exceeds the threshold number of iterations), parity check component 113 can determine, at operation 755, that the corrected word cannot be fully corrected and end the LDPC correction process.

Figure 9:
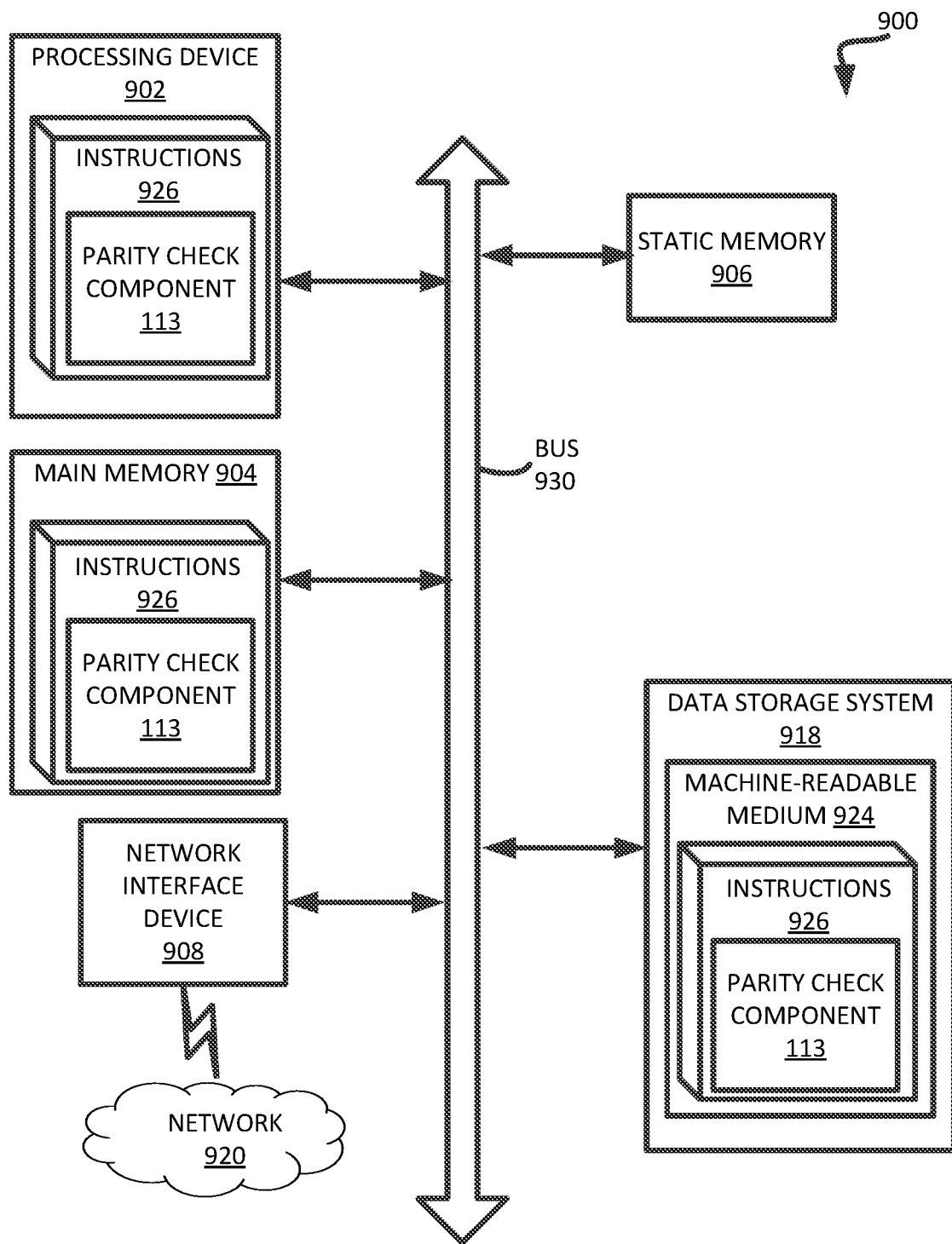
FIG. 9 is a block diagram of an example computer system in which embodiments of the present disclosure may operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the parity check component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to the parity check component 113 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
reading a sense word from the memory device;
executing a plurality of parity check equations on corresponding subsets of the sense word to determine a plurality of parity check equation results;
determining a syndrome for the sense word using the plurality of parity check equation results;
determining whether the syndrome for the sense word satisfies a codeword criterion; and responsive to the syndrome for the sense word not satisfying the codeword criterion, performing an iterative low density parity check (LDPC) correction process, wherein at least one iteration after a first iteration in the LDPC correction process uses a criterion that is based at least partially on a previous iteration or partial iteration, and wherein performing the iterative LDPC correction process comprises flipping any bits in the sense word having an associated energy level that is greater than or equal to a maximum energy level associated with any one bit of the sense word from the previous iteration.

2. The system of claim 1, wherein the processing device to perform further operations comprising:
receiving, from a requestor, a request to read data from the memory device, wherein the sense word is associated with the data; and
responsive to the syndrome for the sense word satisfying the codeword criterion, returning the sense word to the requestor as the requested data.

3. The system of claim 1, wherein each of the plurality of parity check equations corresponds to a different subset of the sense word, and wherein each of the plurality of parity check equation results indicates whether a number of bits set to a value of '1' in a corresponding subset of the sense word is even or odd.

4. The system of claim 1, wherein determining the syndrome for the sense word comprises logically combining the plurality of parity check equation results, and wherein determining whether the syndrome for the sense word satisfies the codeword criterion comprises determining whether all the plurality of parity check equation results in the syndrome are in a satisfied state.

5. The system of claim 1, wherein performing the iterative LDPC correction process comprises:
determining the energy level associated with each bit of the sense word;
determining the maximum energy level associated with the one bit of the sense word;
determining whether a current iteration of the LDPC correction process is the first iteration; and
responsive to the current iteration being the first iteration, flipping any bits in the sense word having an energy level that satisfies an energy threshold condition.

6. The system of claim 5, wherein performing the iterative LDPC correction process further comprises:
responsive to the current iteration not being the first iteration, flipping the bits in the sense word having the associated energy level that is greater than or equal to the maximum energy level associated with the one bit of the sense word from the previous iteration.

7. The system of claim 5, wherein the energy level associated with a given bit of the sense word represents a number of parity check equation results that are in an unsatisfied state for the bit plus the XOR of a current value of the bit with an original value of the bit.

8. The system of claim 1, wherein the processing device to perform further operations comprising:
determining whether a number of iterations performed in the iterative LDPC correction process satisfies an iteration criterion;
in response to the number of iterations performed satisfying the iteration criterion, continuing the LDPC correction process; and
in response to the number of iterations performed not satisfying the iteration criterion, ending the LDPC correction process.

9. A method comprising:
reading a sense word;
executing a plurality of parity check equations on corresponding subsets of the sense word to determine a plurality of parity check equation results;
determining a syndrome for the sense word using the plurality of parity check equation results;
determining whether the syndrome for the sense word satisfies a codeword criterion; and
responsive to the syndrome for the sense word not satisfying the codeword criterion, performing an iterative low density parity check (LDPC) correction process, wherein at least one iteration after a first iteration in the LDPC correction process uses a criterion based at least partially on a previous iteration or partial iteration, and wherein performing the iterative LDPC correction process comprises flipping any bits in the sense word having an associated energy level that is greater than or equal to a maximum energy level associated with any one bit of the sense word from the previous iteration.

10. The method of claim 9, further comprising:
receiving, from a requestor, a request to read data, wherein the sense word is associated with the data; and
responsive to the syndrome for the sense word satisfying the codeword criterion, returning the sense word to the requestor as the requested data.

11. The method of claim 9, wherein each of the plurality of parity check equations corresponds to a different subset of the sense word, and wherein each of the plurality of parity check equation results indicates whether a number of bits set to a value of '1' in a corresponding subset of the sense word is even or odd.

12. The method of claim 9, wherein determining the syndrome for the sense word comprises logically combining the plurality of parity check equation results, and wherein determining whether the syndrome for the sense word satisfies the codeword criterion comprises determining whether all the plurality of parity check equation results in the syndrome are in a satisfied state.

13. The method of claim 9, wherein performing the iterative LDPC correction process comprises:
determining the energy level associated with each bit of the sense word;
determining the maximum energy level associated with the one bit of the sense word;
determining whether a current iteration of the LDPC correction process is the first iteration; and
responsive to the current iteration being the first iteration, flipping any bits in the sense word having an energy level that satisfies an energy threshold condition.

14. The method of claim 13, wherein performing the iterative LDPC correction process further comprises:
responsive to the current iteration not being the first iteration, flipping the bits in the sense word having the associated energy level that is greater than or equal to the maximum energy level associated with the one bit of the sense word from the previous iteration.

15. The method of claim 13, wherein the energy level associated with a given bit of the sense word represents a number of parity check equation results that are in an unsatisfied state for the bit plus the XOR of a current value of the bit with an original value of the bit.

16. The method of claim 9, further comprising:
determining whether a number of iterations performed in the iterative LDPC correction process satisfies an iteration criterion;

in response to the number of iterations performed satisfying the iteration criterion, continuing the LDPC correction process; and in response to the number of iterations performed not satisfying the iteration criterion, ending the LDPC correction process.

17. A non-transitory computer-readable storage medium comprising instructions that, when executed by a processing device, cause the processing device to perform operations comprising:

reading a sense word from a memory device;

executing a plurality of parity check equations on corresponding subsets of the sense word to determine a plurality of parity check equation results;

determining whether the plurality of parity check equation results indicates an error in the sense word; and responsive to the parity check equation results indicating an error in the sense word:

performing a first iteration of an error correction process; and performing one or more subsequent iterations of the error correction process, wherein the one or more subsequent iterations comprise flipping any bits in the sense word having a number of parity check equation results that are in an unsatisfied state equal to a maximum number of parity check equation results that are in the unsatisfied state for any one bit of the sense word from a previous iteration or partial iteration.

18. The non-transitory computer-readable storage medium of claim 17, wherein each of the plurality of parity check equations corresponds to a different subset of the sense word, and wherein each of the plurality of parity check equation results indicates whether a number of bits set to a value of '1' in a corresponding subset of the sense word is even or odd.

19. The non-transitory computer-readable storage medium of claim 17, wherein determining whether the plurality of parity check equation results indicates an error in the sense word comprises determining whether all of the plurality of parity check equation results are in a satisfied state.

20. The non-transitory computer-readable storage medium of claim 17, wherein performing the first iteration of the error correction process comprises:

determining a number of parity check equation results that are in an unsatisfied state for each bit of the sense word;

determining a maximum number of parity check equation results that are in the unsatisfied state for any one bit of the sense word; and flipping any bit in the sense word having a number of parity check equation results that are in the unsatisfied state that satisfies an energy threshold condition.

* * * * *